(12) United States Patent
Akkipeddi et al.

(10) Patent No.: US 7,208,096 B2
(45) Date of Patent: Apr. 24, 2007

(54) METHOD OF CLEAVING GAN/SAPPHIRE FOR FORMING LASER MIRROR FACETS

(75) Inventors: Ramam Akkipeddi, Singapore (SG); Zhongli Li, Singapore (SG); Sudhiranjan Tripathy, Singapore (SG); Soo Jin Chua, Singapore (SG)

(73) Assignee: Agency for Science, Technology and Research, Singapore Science Park (SG)

( * ) Notice: Subject to any disclaimer, the term of this patent is extended or adjusted under 35 U.S.C. 154(b) by 184 days.

(21) Appl. No.: 10/602,714

(22) Filed: Jun. 25, 2003

(65) Prior Publication Data

US 2004/0202217 A1   Oct. 14, 2004

(30) Foreign Application Priority Data

Jun. 26, 2002   (SG) .............................. 200203864-4

(51) Int. Cl.
  *B44C 1/22*   (2006.01)
  *B23K 23/00*  (2006.01)

(52) U.S. Cl. ...................... 216/65; 216/58; 219/121.6; 219/121.67; 438/33; 438/460

(58) Field of Classification Search .................. 216/58, 216/65; 219/121.6, 121.67; 438/33, 460; 372/43.01
  See application file for complete search history.

(56) References Cited

U.S. PATENT DOCUMENTS

| | | | |
|---|---|---|---|
| 5,814,532 A | 9/1998 | Ichihara | |
| 5,821,568 A | 10/1998 | Morita et al. | |
| 5,825,789 A | 10/1998 | Watanabe et al. | |
| 5,985,687 A | 11/1999 | Bowers et al. | |
| 6,077,720 A | 6/2000 | Yamaoka et al. | |
| 6,379,985 B1 | 4/2002 | Cervantes et al. | |
| 6,411,636 B1* | 6/2002 | Ota et al. | 372/43.01 |
| 6,482,666 B1* | 11/2002 | Kobayashi et al. | 438/33 |
| 2002/0081800 A1* | 6/2002 | Morita | 438/237 |

FOREIGN PATENT DOCUMENTS

| | | |
|---|---|---|
| EP | 1 014 520 B1 | 9/2004 |
| JP | 9-298339 A | 11/1997 |
| JP | 10-190149 A | 7/1998 |
| JP | 10-242570 | 9/1998 |
| JP | 2003-46177 A | 2/2003 |

OTHER PUBLICATIONS

Itaya, Kazuhiko et al., Jpn. J. Appl. Phys., vol. 35, pp. 1315-1317, (1996).

(Continued)

*Primary Examiner*—Shamim Ahmed
(74) *Attorney, Agent, or Firm*—Birch, Stewart, Kolasch & Birch, LLP

(57) ABSTRACT

A laser device has a substrate and at least one GaN-based layer upon a first surface of the substrate, and the laser device is cleaved by cutting linear grooves into a second surface of the substrate such that the grooves are in alignment with vertical planes of the substrate. The substrate and the at least one GaN-based layer are cleaved along the vertical planes. The cutting is performed using a laser beam from an external laser source.

17 Claims, 7 Drawing Sheets

OTHER PUBLICATIONS

Kneissl, M. et al., Applied Physics Letters, vol. 72, No. 13, pp. 1539-1541, (1998).

Nakamura, S., "Present Status of InGaN-Based Laser Diodes", Department of Research and Development, Nichia Chemical Industries, Ltd., pp. 15-22, (1999).

Tripathy, S., Center for Optoelectronics, Department of Electrical and Computer Engineering, National University, pp. 2522-2532, (2001).

Tripathy, S. Department of Electrical and Computer Engineering, Center for Optoelectronics, National University of Singapore, vol. 91, No. 9, pp. 5840-5842, (2002).

Abare, A.C. et al., IEEE Journal of Selected Topics in Quatum Electronics, vol. 4, No. 3, pp. 505-509, (1998).

Tripathy, S. et al., Journal of Applied Physics, vol. 85, No. 12, pp. 8386-8399, (1999).

* cited by examiner

METHOD OF CLEAVING GAN/SAPPHIRE FOR FORMING LASER MIRROR FACETS

TECHNICAL FIELD

This invention relates to the fabrication of GaN-based laser devices. In particular, the invention relates to a method of forming mirror facets in such laser devices.

BACKGROUND TO THE INVENTION

Laser diodes based on metallic nitrides, such as GaN and other Group III-V semi-conductors are of great commercial interest. These diodes have a wide range of uses and potential uses for visible light and UV applications as well as for high density data storage systems. Typically, such laser diodes operate in the blue region of the optical spectrum.

These laser diodes are typically fabricated by depositing, on a sapphire substrate, a number of layers of GaN-based semi-conductors. C-plane and A-plane are the primary orientations employed for the sapphire substrates in the manufacture of such diodes.

In order to generate an inductive emission in a semiconductor device such as a laser diode, a pair of optical facets are required to enclose and reflect the light on the two sides of the light emitting area and to form a resonator between the facets.

These facets (or mirrors) are formed at the end of the laser cavity. The facets are typically created by dry etching or, as is preferred, by cleaving the sapphire substrate and GaN layers. In order to form cleaved facets in laser diodes, smooth and vertical cleave planes are required in the region where the optical modes are contained. This region is usually limited to the epitaxial layers. To form facets that are both smooth and vertical across the epitaxial layers, the crystal structure of the substrate and the epitaxial layers must have vertical planes.

Ideally, the cleavage occurs along the crystal planes of the GaN layers leaving smooth facets that are perpendicular to the direction of light propagation in the laser.

Generally, the cleaving is accomplished by cutting the back side of the sapphire substrate (that is, the side which does not have the GaN layers formed thereon). This cutting is generally effected by a dicing saw or a scribe to form elongated grooves in the sapphire substrate. The troughs of these grooves then become cleavage points.

It is not easy to cleave sapphire. In order to achieve cleaving, it is generally necessary to thin the sapphire substrate down to about 100 μm (from about 350–400 μm). Also, cleavage will be easier and result in a better product if the cleavage plane of the sapphire substrate matches the cleavage (crystal) planes of the GaN layers. However, before cutting the grooves (eg. with a dicing saw or scribe) it is often difficult to match (or align) the cleavage plane of the sapphire substrate with that of the GaN layers. The crystal planes of the GaN layers are generally not well aligned with the crystal planes of the sapphire. As noted above, upon cleaving, the facet of the substrate may not be properly aligned with the facet of the GaN layers. In order to overcome these problems, additional, time-consuming steps often need to be taken which may include polishing of the facets.

In order to improve the quality of mirrors formed from such cleaved facets, the application of high reflectivity coatings has been used. Also, dry etching methods have been utilised, such as reactive ion etching (RIE) and reactive ion beam etching (RIBE). These methods have been used to smooth the facets without having to resort to mechanical polishing. However, these etching processes have proven to be time-consuming and difficult to perform.

Due to greater ease of manufacture and the formation of anisotropic facets, cleaved laser mirrors are preferred to the dry etched facets. Additionally, cleaved facets do not require any dry etching for mirror formation.

Laser diodes relying on cleaved or etched GaN/air facets are quite sensitive to external optical feedback. One significant problem of forming light reflectivity facets is the low refractive index of GaN (at 400 nm). This leads to a significantly reduced mirror reflectance which can be further decreased by any interface roughness (which is typical of dry chemically etched laser facets and cleaved facets). It has been found that facet surface roughness of about 20 nm can reduce the reflection of the laser mode by an order of magnitude.

Conventional laser devices, made on GaAs/InP substrates are largely fabricated by cleaving methods, owing to the ease of cleaving along the well defined crystal planes ([110] and [1-10]). This results in highly anisotropic and smooth facets for the laser resonator cavity. However, it can be very difficult to neatly cleave GaN-based epilayers on sapphire substrates because the cleavage plane of the sapphire generally does not coincide with the cleavage plane of the GaN layers.

Accordingly, this invention is directed towards an improved method of cleaving GaN layers on a substrate such as sapphire.

SUMMARY OF THE INVENTION

According to a first aspect of this invention, there is provided a method of fabricating a cleaved facet of a laser device having a substrate and at least one GaN-based layer formed upon a first surface of the substrate, said method including the following steps:

cutting linear grooves into a second surface of the substrate, said grooves being in alignment with vertical planes of said substrate; and cleaving said substrate and said at least one GaN-based layer along said vertical planes;

wherein said cutting is effected by a laser beam from an external laser source.

The substrate is generally formed of sapphire. C-plane sapphire is particularly preferred.

The vertical planes of the substrate are preferably selected from one or more of the m-planes (1$\bar{1}$00) and the a-planes (1$\bar{1}$20). The a-planes (1$\bar{1}$20) are particularly preferred.

The thickness of the substrate is generally less than about 400 μm or, preferably, between about 350 μm and about 400 μm.

The linear grooves are typically cut to a depth of from about 40 μm to about 100 μm. It is particularly preferred that the grooves are cut to a depth of between about 50 μm and about 80 μm.

The depth of the linear grooves may be controlled by varying numerous process parameters including the intensity of the laser beam, the speed at which the laser beam is scanned over the grooves and the number of times the laser beam is scanned over said grooves. Other process parameters can also be manipulated to affect the depth of the grooves.

The laser beam may be focused on the second surface of the substrate within a radius of from 20 μm to 30 μm at $1/e^2$ density. The average power of the laser beam is preferably about 1.4 W. Typically, the repetition rate of the laser beam is from about 2 kHz to about 5 kHz. It is preferred that the pulse width of the laser beam is from about 5 ns to about 30 ns.

The laser beam may be scanned over the second surface of the substrate any number of times in order to help achieve grooves of the desired depth. It has been found that 2 to 12 scans at a velocity of about 1 mm/sec is generally suitable to achieve the desired depth.

At least one GaN-based layer is formed on the first (ie. upper) surface of the substrate (as mentioned above). It is preferred that a plurality of GaN-based layers are formed on the sapphire substrate. The plurality of GaN-based layers may include GaN/InGaN/AlGaN layers. These GaN-based layers may be formed using epitaxial lateral overgrowth (ELOG) techniques.

Throughout this specification, unless the context requires otherwise, the word "comprise" or variations such as "comprises" or "comprising", will be understood to imply the inclusion of a stated element, integer or step, or group of elements, integers or steps, but not the exclusion of any other element, integer or step, or group of elements, integers or steps.

Any discussion of documents, acts, materials, devices, articles or the like, which has been included in the present specification, is solely for the purpose of providing a context for the present invention. It is not to be taken as an admission that any or all of these matters form part of the prior art base or were common general knowledge in the field relevant to the present invention as it existed before the priority date of each claim of this application.

In order that the present invention may be more clearly understood, the prior art and preferred forms of the invention will be described with reference to the following drawings and examples.

BRIEF DESCRIPTION OF THE DRAWINGS

FIG. 1(a) is an optical micrograph of a laser cut and cleaved sapphire facet formed according to a preferred embodiment of the method of this invention in which the laser power was 1.4 W, the scanned velocity was 1 mm/sec, the repetition rate of the laser beam was 3 kHz and the number of scans conducted was 4. The optical micrograph shows two distinct regions (A and B) of the facet. Region A is a laser-cut region which appears dark (due to burning of the structure under high power). Region B is a cleaved region in which the facet appers to be non-jagged.

FIG. 1(b) is an AFM micrograph of Region A of the sapphire facet shown in FIG. 1(a). This Region A shows a r.m.s roughness of 240 nm.

FIG. 1(c) is an AFM micrograph of Region B of the sapphire facet shown in FIG. 1(a). This Region B shows a r.m.s. roughness of 19 nm.

Figure 2A:
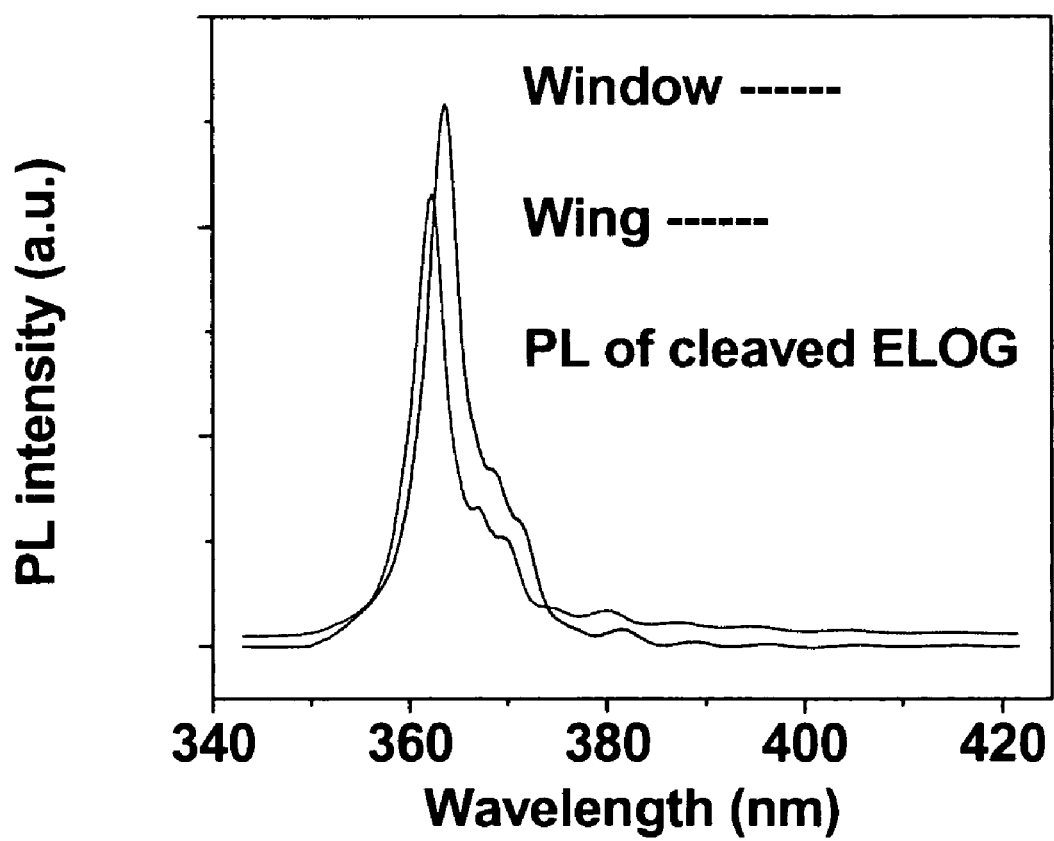
FIGS. 2(a) and 2(b) are graphs showing the micro-PL spectra from the cross-sectional cleaved positions of a laser structure formed according to a preferred embodiment of the method of this invention.
Figure 2B:
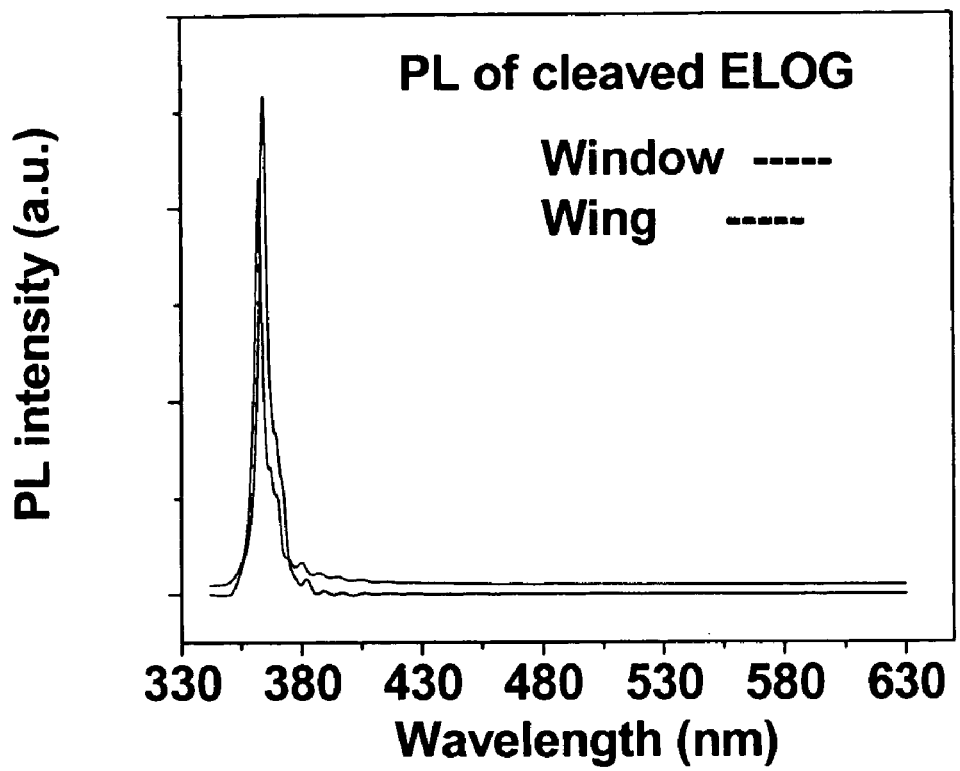

The graphs of FIGS. 2(a) and 2(b) show the micro-PL spectra from laser structure grown on ELO GaN. The spectra were recorded at room temperature using 325 nm line of He—Cd laser.

Figure 3A:
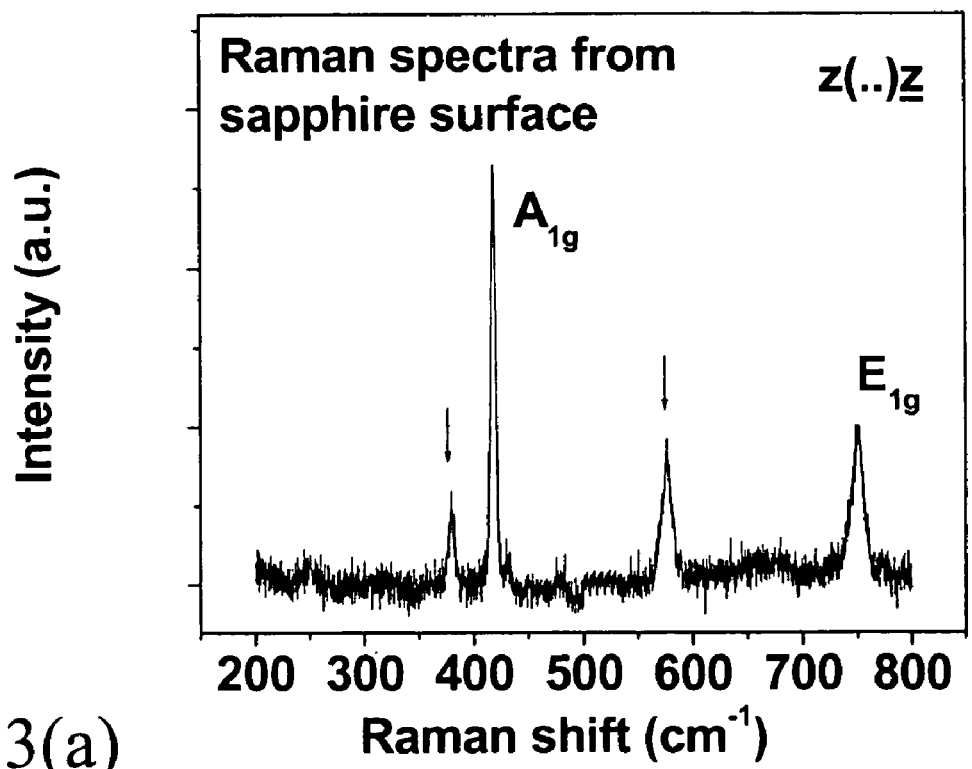
FIGS. 3(a) and 3(b) are graphs showing Raman spectra from the surface of the sapphire substrates of laser structures formed according to a preferred embodiment of the method of this invention.
Figure 3B:
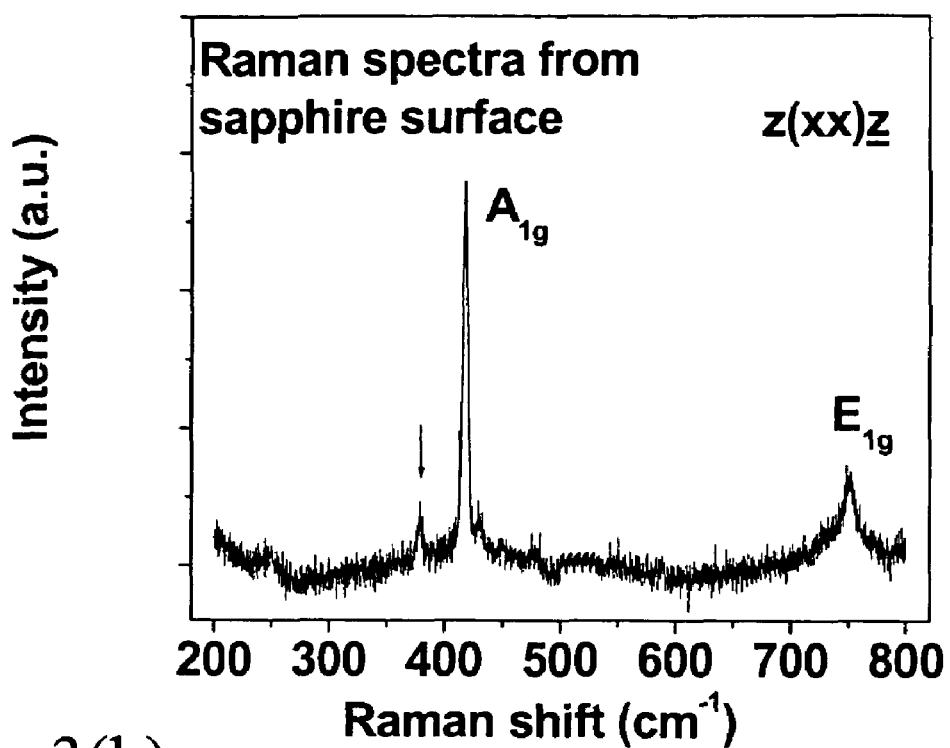

The graphs of FIGS. 3(a) and 3(b) show Raman spectra from the surface of a sapphire substrate under different polarisation conditions.

Figure 3C:
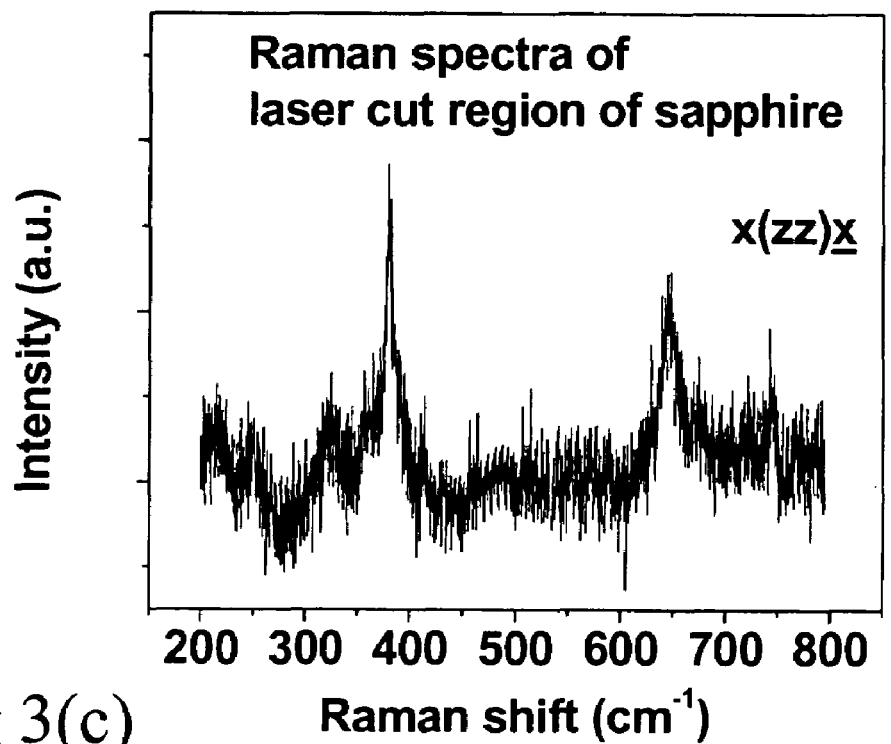
FIG. 3(c) is a graph showing Raman spectra from a laser-cut region of a sapphire substrate of a laser structure formed according to a preferred embodiment of the method of this invention.
Figure 3D:
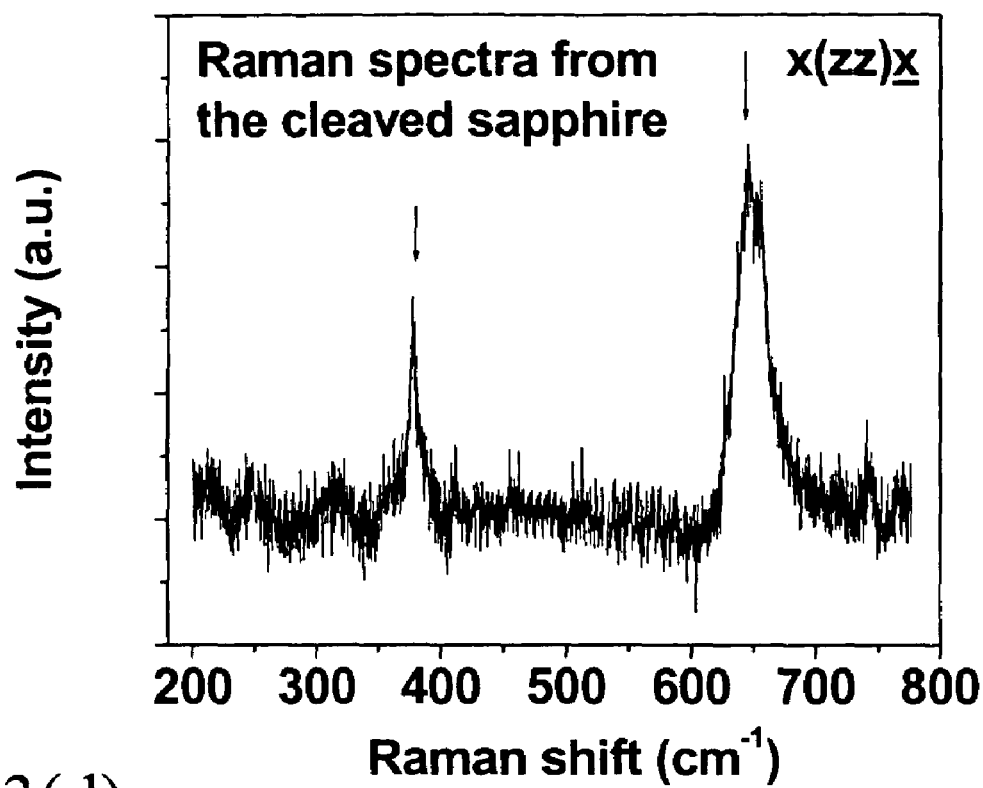
FIG. 3(d) is a graph showing Raman spectra from a cleaved region of a sapphire substrate of a laser structure formed according to a preferred embodiment of the method of this invention.
Figure 4A:
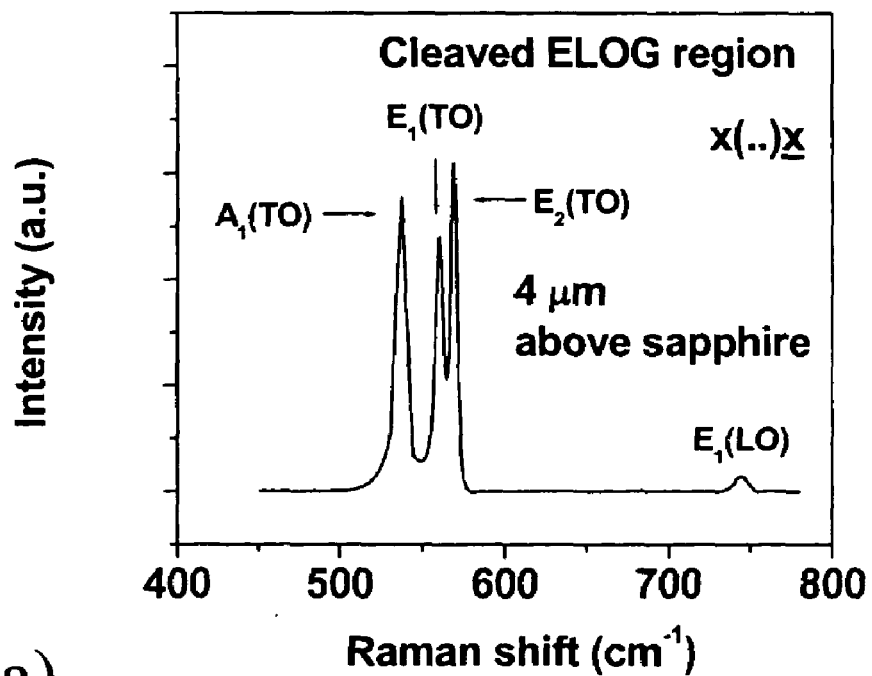
FIG. 4(a) is a graph showing Raman spectra from a cleaved ELOG region 4 μm above the sapphire substrate in the x(..)x̄ geometry, in a laser structure formed according to a preferred embodiment of the method of this invention.
Figure 4B:
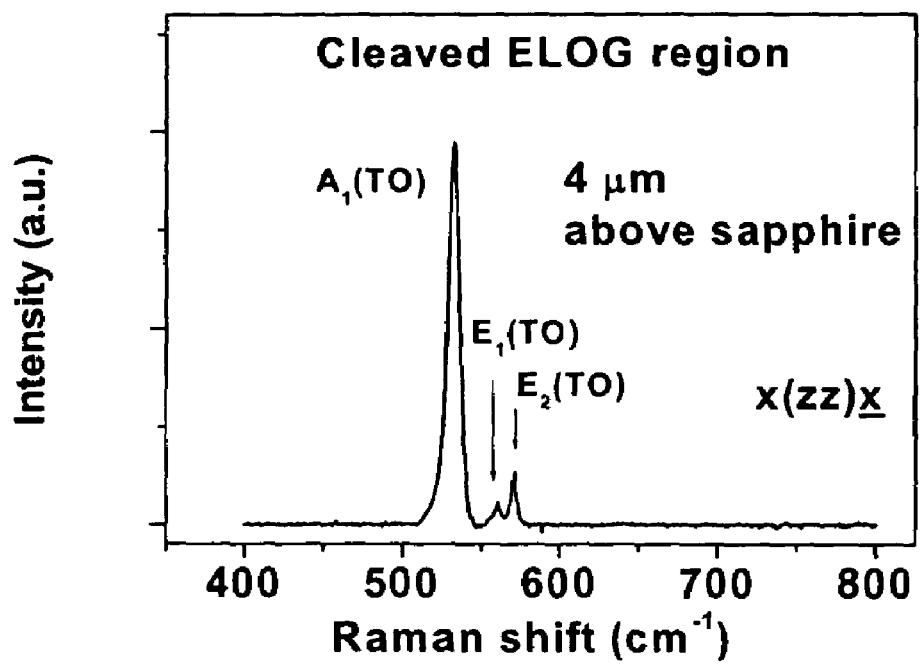
FIG. 4(b) is a graph showing Raman spectra from a cleaved ELOG region 4 μm above the sapphire substrate in the x(zz)x̄ geometry, in a laser structure formed according to a preferred embodiment of the method of this invention.
Figure 4C:
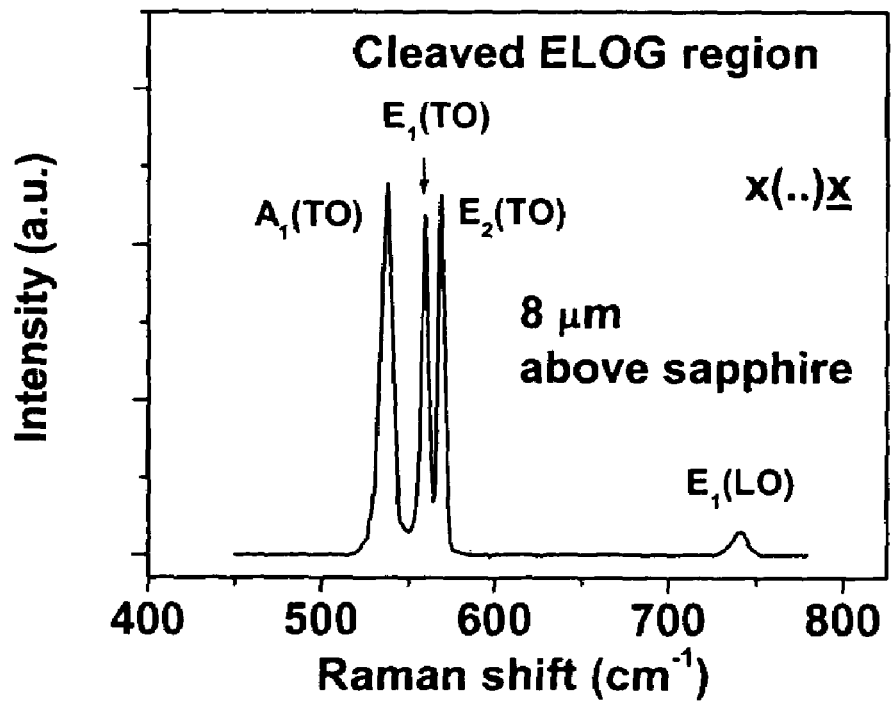
FIG. 4(c) is a graph showing Raman spectra from a cleaved ELOG region 8 μm above the sapphire substrate in the x(..)x̄ geometry, in a laser structure formed according to a preferred embodiment of the method of this invention.
Figure 4D:
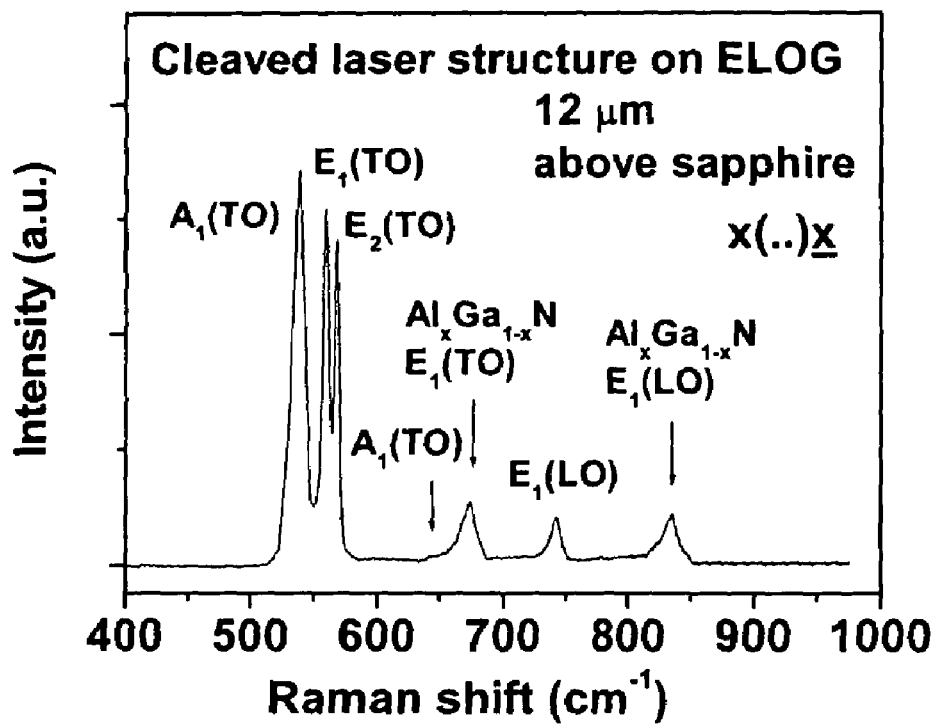
FIG. 4(d) is a graph showing Raman spectra from a cleaved ELOG region 12 μm above the sapphire substrate in the x(..)x̄ geometry, in a laser structure formed according to a preferred embodiment of the method of this invention.
Figure 4E:
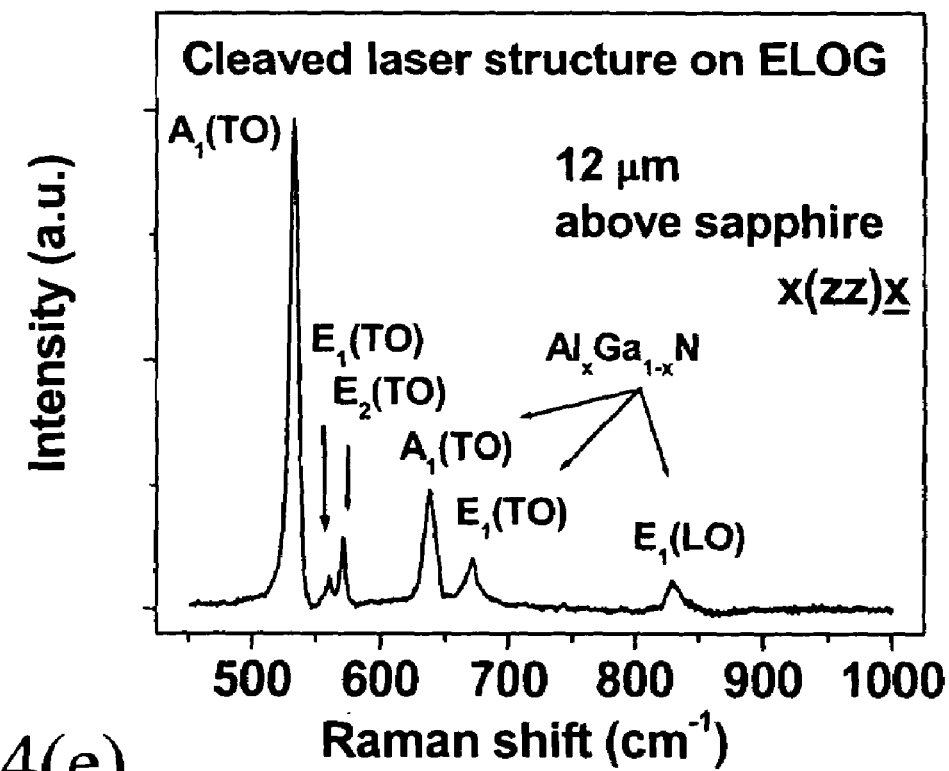
FIG. 4(e) is a graph showing Raman spectra from a cleaved ELOG region 12 μm above the sapphire substrate in the x(zz)x̄ geometry, in a laser structure formed according to a preferred embodiment of the method of this invention.

The graphs of FIGS. 3(c) and 3(d) show Raman spectra from the laser cut region and the cleaved region, respectively, of the sapphire substrate.

FIGS. 4(a) to 4(e) are as described above.

EXAMPLE

Experimental Method

Experiments have been conducted on bare sapphire substrates, GaN/sapphire and ELOG structures on sapphire. ESI Microvia Drill M5200 system was used in this study, with a Q-switch third harmonic of Nd:YAG pulse laser operating at 355 nm. Laser light was focused onto the sample surface within a radius of 25 μm (at $1/e^2$ density). Laser average power and repetition rate in this study were 1.4 W and 3 kHz, respectively. Pulse width was about 20 ns.

In ESI laser processing system, the laser optics directs and focuses the laser beam from the laser rail to the sample, which is held on the machine work surface by vacuum. The cross-axis laser-beam positioner consists of linear stages and scanners. Movement of the scanner and linear stage motors is co-ordinated by the electronic control system. Both the scanners and linear motors move continuously to achieve the specified XY pattern on the sample. In order to study the effects of laser cutting depth on cleaved surface roughness, a laser beam was scanned over sample surface for about 2 to 12 times at a velocity of 1 mm/sec.

For laser cutting, the sample was placed on a sample holder plate that is adjusted to the desired planarity and parallelism so that backside sapphire basal plane is held exactly perpendicular to the laser beam with uniform exposure applied to the surface. The cutting speed can be controlled by mechanical adjustment. Extensive care was taken during this processing so that the laser beam does not create friction, spatial shift or vibration. Laser power, cutting speed, and area r.m.s. roughness were optimised to obtain a smooth facet.

Cutting c-plane sapphire to 50–100 µm is sufficient for reliable cleaving. Since sapphire does not have to be thinned as much, many problems with the cracking of sapphire are reduced. Secondly, for a cleave that starts in the 50–80 µm range, the angular misalignment is negligible and the fracture does not propagate along the C-plane of the GaN. Therefore, lasers can be easily fabricated using these facets. Facets produced in this manner appear to be optically flat when examined under Ziess optical microscope. Optical spectroscopy measurements were carried out from the facets of laser bars with width of from 300 µm–2 mm.

The surface topography was imaged using the Topometrix atomic force microscopy (AFM) set up, operating in a contact mode with a SiN tip. The cleaved facets were characterised by spatially resolved room-temperature Raman scattering using 514.5 nm line of the argon ion laser. The scattered light was dispersed through the JY-T64000 triple monochromator system attached to a liquid nitrogen cooled CCD detector. The accuracy during the Raman measurements was 0.2 cm$^{-1}$ with a lateral spectral resolution of 1.0 µm. Cross-sectional Raman measurements were performed on the cleaved regions as well as on the laser cut regions of the facets. The 325 nm line of a He—Cd laser was used as an excitation source for PL measurements using standard Renishaw 2000 micro-Raman-PL set up attached to a CCD detector. The samples were excited either perpendicular or parallel to the facet depending on the scattering geometry. The scattered light was detected in several back scattering geometry, which correspond to either an x(zz)x ($A_1$) or x(yz)x ($E_1$) configuration. Micro-Raman measurements were carried out along (0001) direction from the buffer to the top surface in the laser facet spanning the wing and window regions of the ELOG sample.

Results and Discussion

GaN crystallizes in wurtzite crystal symmetry and falls into $C_{6v}^4$ (P6$_3$mc) space group. Sapphire belongs to space group R$\bar{3}$c(D$_3^6$d). The crystal structure of sapphire can be described as $O^{2-}$ anions in approximately hexagonal-closed-packed arrangement, with Al$^{3+}$ cations occupying two-thirds of the octahedral voids. The c-axis of the GaN is perpendicular to the C-plane of the sapphire substrate. Therefore, for GaN grown on C-plane (0001) of sapphire, the in plane orientations of the film was found to be GaN (11$\bar{2}$0) ∥ sapphire (1$\bar{1}$00). The mismatch is about 14% between the wurtzite basal plane unit cell and a smaller hexagonal cell within the sapphire unit cell. The smaller cell of Al atoms on the basal-plane sapphire is oriented 30° away from the larger sapphire unit cell, in agreement with the GaN orientation found experimentally.

For forming cleaved facets in laser diodes, smooth and vertical cleave planes are required in the region where the optical mode is contained. This region is usually limited to the epitaxial layers. To form facets that are both smooth and vertical across the epitaxial layers, the crystal structure of the substrate and the epilayer must have vertical planes. In addition, the vertical cleave planes must lie in the same plane. In basal-plane (c-plane) sapphire, the {11$\bar{2}$0} planes (a-planes) can be used as vertical cleave planes. Due to atomic line up during growth, each of the sapphire a-planes is 30° away from the GaN a-planes. Therefore, either m-plane {1$\bar{1}$00} of sapphire or the m-plane of GaN must be used as one of the cleave planes. Force cleaving along the m-plane of sapphire is possible, but this plane has slightly higher bond strength than the a-plane. It is desirable to make a good cleaving using the sapphire a-plane. These cleave planes are not the planes with the weakest bond strength.

The {1$\bar{1}$02} planes (r-planes) are generally regarded as the preferred cleavage planes for sapphire. However, these planes are not perpendicular to the substrate surface and therefore do not form good mirrors. The sapphire can be forced to break along a-planes, but these planes are close in angular position to the r-planes. This means that it is very easy to couple from one cleave plane to another, and thus jagged facets were formed during sawing and cleaving the GaN structure grown on thick 400 µm sapphire. In addition, sawing, scribing and force breaking/cleaving often results in misorientation of the GaN and sapphire cleaves planes. To prevent the coupling between cleavage-planes, the sapphire substrate generally needs to be lapped or thinned before it is cleaved. The 350–400 µm thick sapphire substrates have to be polished down to 50–80 µm before they are sawn or cleaved. Due to rigidity, thinned or polished sapphire substrates might lead to cracking.

Instead of lapping or polishing, the backside laser cutting procedure of the present invention was used. High power uv excimer laser beam was aligned and focused on the back side of the sapphire substrate. The focused spot size of the beam was 25 µm. The beam was allowed to move rapidly either along (1$\bar{1}$00) or (11$\bar{2}$0) direction of the sapphire substrate and the cutting of sapphire was controlled by the applied laser power. The intense beam was allowed to run three/four times along the same direction to control the cutting depth of sapphire. In this procedure, the frequent movement and penetration of the beam can be controlled mechanically (same as shear force feedback) and the beam can cut the sapphire deep down to 50 µm without any damage to the laser structure and active regions. After backside cutting, the structures were easily cleaved along the desired cleaved planes (either along (1$\bar{1}$00) or (11$\bar{2}$0) direction). The cleaved facets thus obtained were vertical and smooth. Facet roughness measured by AFM technique shows marked variation of r.m.s. with laser power. In addition, the roughness also shows variation with the number of times the laser beam is scanned on the backside of the sapphire to make it penetrate deeper towards GaN structure. This is designated as frequency of laser cutting (n=1, 2, 3, or 4). In order to obtain smooth facets and optimise conditions to cut the sapphire deeper and deeper, series of measurements were performed. Initially, sapphire wafers were cut deeper along different orientations and the remaining structure was cleaved. The laser beam power and frequency of laser cutting was varied to cut the sapphire wafers from the backside. AFM (atomic force microscopy) measurements were carried out on the cut and cleaved regions of the sapphire substrates.

Figure 1A:
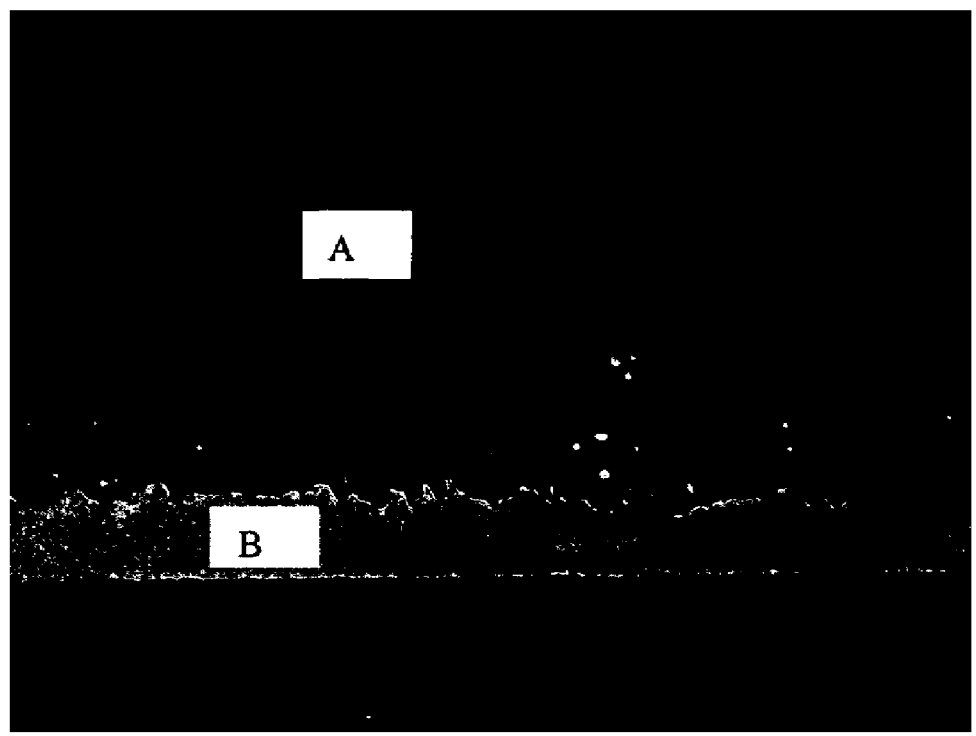
FIG. 1(a) is an optical micrograph of sapphire facets formed according to a preferred embodiment of the method of this invention.
Figure 1B:
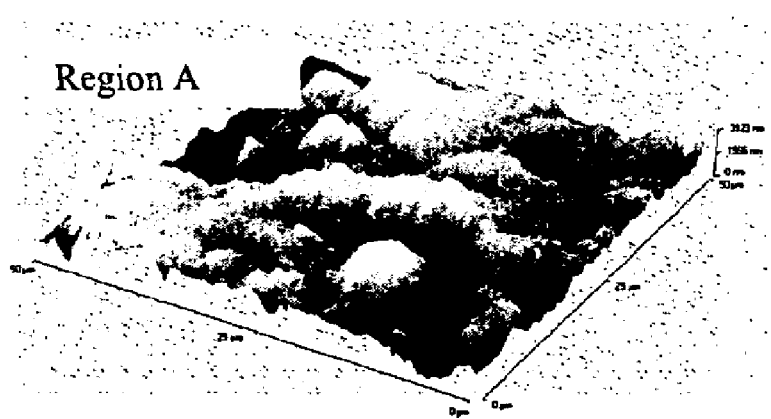
FIG. 1(b) is an AFM micrograph of Region A of the sapphire facet shown in FIG. 1(a).
Figure 1C:
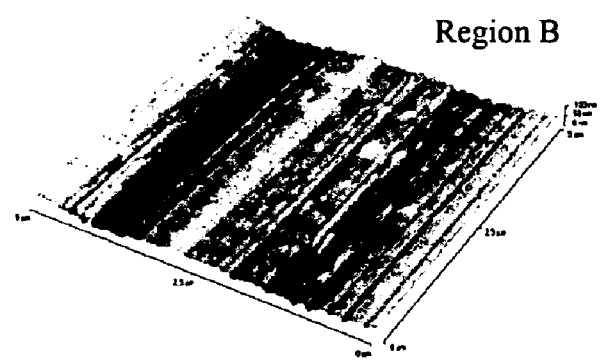
FIG. 1(c) is an AFM micrograph of Region B of the sapphire facet shown in FIG. 1(a).

FIG. 1 shows optical and AFM micro-graphs of the sapphire facets cut under certain conditions and then cleaved to form vertical facets. The figures show two distinct regions. The laser cut region is dark (blackened due to burning of structure under high power). The regions may be covered by carbon and oxygen. The cleaved region is bright and can be seen clearly without jaggedness of the facet.

TABLE 1

| Structures | Area r.m.s. roughness (5 × 5 µm scan) | | |
|---|---|---|---|
| | Laser cut sapphire facet | Cleaved sapphire facet | Cleaved GaN laser facet |
| Sapphire (0001) | 90–260 nm | 19–26 nm ($r_{av}$ = 22 nm) | — |
| Laser structure on ELOG and sapphire (0001) | 54–70 nm | 16–26 nm ($r_{av}$ = 21 nm) | 13–19 nm ($r_{av}$ = 15 nm) |

Table 1 shows AFM roughness (5×5 µm scan) of the cut/cleaved sapphire at different positions. The roughness measurements were carried out on the laser cut regions as well as on the cleaved regions of sapphire. Measurements were taken on three different regions of the cleaved sapphire facet and the average r.m.s. roughness ($r_{av}$) in this region was estimated to be in the range 20–250 nm under different conditions. Under optimised conditions, the cleaved sapphire shows an r.m.s. roughness of 20 nm (5×5 µm scan). The dark laser cut regions are very rough due to burning of sapphire and deposition of carbon and oxygen contaminants, where r.m.s. roughness varied in the range 150–700 nm. The region of our interest is the cleaved sapphire region, where we have produced very smooth facets of sapphire have been produced without misorientation. Series of experiments were carried out to test this procedure on GaN layer on sapphire as well as GaN/InGaN/AlGaN based laser diode structures grown on C-plane (0001) sapphire. In each case, the roughness of the cleaved facets in the three regions was estimated under optimised conditions of cutting sapphire from backside.

AFM measurements on GaN laser structure grown on sapphire shows facet roughness in the range 48–57 nm on the sapphire cleaved region and 40–47 nm in the GaN cleaved region. Such a mechanical coupling can occur through a small amount of surface roughness in the interface of cleaved sapphire and GaN laser facets and due to a slight misalignment of the cleaving forces. There was no cracks formation and propagation to the active region of the laser diodes by this method. Thin stripes of laser bars with width 280–500 µm were prepared for optical measurements.

Finally, this method was applied to a laser structure grown on ELOG using optimized laser cut conditions. Thin laser bars were cleaved from a 2 inch wafer and the widths of these thin stripes were varied from 300–800 µm. The roughness of the laser cut region of sapphire was about 120 nm due to surface contaminants resulting from burning. However, the cleaved region of sapphire shows roughness of less than 40 nm. The facet roughness in the cleaved region of ELOG and laser structure was less than 20 nm, which is one of the best results reported so far for cleaved laser mirrors. The results on three different structures are different. Sapphire cleaved facets are quite smooth. Facets formed by laser cutting of sapphire from backside and cleaving the rest of the laser structure shows roughness variation depending on the substrate and growth conditions. The facets are quite smooth and vertical on the laser structure grown on ELOG compared to laser structure grown on sapphire. This is probably associated with growth anisotropy of laser structure and orientation of the laser cutting procedure.

To shed some light on these aspects, optical spectroscopy measurements were carried out on the cleaved facets formed by laser cutting of sapphire from backside. The optical properties of the cleaved ELO GaN were investigated using PL and Raman scattering techniques. There are no step terminations visible at the surface on the coalescence area and the AFM micro-graphs indicate the absence of screw-component threading dislocations in this region. The presence of pure edge dislocations cannot be assessed with AFM analysis since they are harder to resolve. The micro-PL spectra from the cross sectional cleaved positions are shown in FIG. 2. The 325 nm line of a He—Cd laser was used as the source of excitation. As seen in the spectra, the room temperature PL from the ELO region is dominated by the band-edge transitions at 364 nm. The absence of yellow luminescence (YL) bands in the film shows the high quality of the ELO structures. The band edge PL from the overgrown and the window region shows a peak-shift of 2.0 nm. The red shift of the observed PL from the ELO GaN compared to the window GaN confirms that biaxial strain is relaxed. The observed line width of the band-to-band transition in LEO GaN shows improvement of GaN quality under a strain-free and relaxed environment. In the PL spectra, the peak at 369 nm can also be related to near-band-edge excitonic transitions associated with donors. The bands are much broader at room temperature and cannot be well resolved. These bands are weak in the ELO region and stronger in the coherently grown region. The laser emission by optical pumping from the laser structure grown on ELOG was observed near 400 nm. The active layer was GaN/InGaN multi-quantum wells with $Al_xGa_{1-x}N$ cladding layers and the cleaved mirror facet formed was vertical and smooth.

Cross-sectional Raman measurements were conducted at different positions of the cleaved facets. In each case, different polarisation configurations were used. FIG. 3 shows the Raman spectra of cleaved sapphire region. Strong $A_{1g}$ and $E_{1g}$ modes of sapphire were observed near 418, 578 and 750 cm$^{-1}$. Sapphire modes near 379 and 645 cm$^{-1}$ are observed in the cross section geometry and shows intensity enhancement in the cleaved region compared to the laser cut regions. FIG. 4 shows the Raman spectra of individual ELO GaN stripes from the cross-sectional view under different polarisation conditions. We found that all the phonons are allowed by selection rules. The $A_1$(TO), $E_1$(TO), and $E_2$(TO) phonons of GaN were observed near 533, 559, and 568 cm$^{-1}$, respectively. The $E_1$(LO) mode of GaN from the cleaved region was observed near 741 cm$^{-1}$. We have observed a peak shift of 2.0 cm$^{-1}$ and a 30% change in line width of the $E_2$(TO) phonon in the ELO region, compared with the GaN buffer region. We have estimated the strain tensor components quantitatively in the overgrown and the window regions. The relaxation of the strain in the ELO region is associated with less dislocation density in the film. The dominant features in all spectra, are the $A_1$(TO) and the $E_2$(TO) phonon band near 533 and 568 cm$^{-1}$, which are narrow in the ELO region and represents high crystalline quality of the GaN. Using $A_1$(TO) and $E_2$(TO) mode peak positions, the local strain distribution was measured. The polarisation breakdown and observation of much weaker forbidden modes in ELO GaN can be related to change in the geometry associated with crystallographic tilting. The dislocation bundling gives rise to crystallographic tilting (0.2–1.0°) in the overgrown region on the mask and leads to a total reduction of threading dislocations in the film. The wing tilt of c-axis towards the $\langle 11\bar{2}0 \rangle$ direction during ELOG growth and cleaving induced tilt (misalignment of the epilayer a-planes with sapphire m-planes) results in appearance of forbidden modes in cross-sectional polarised measurements. The observation of forbidden Raman modes just above the mask region suggests that the local changes in the microstructures can produce corresponding change in the spectra.

To map the Raman results with the quality of cleaved facets, measurements on entire facets of the laser structure were carried out. Raman intensity and line width of the polar modes, represent the crystal quality of the facets. Apart from the strong phonon modes of GaN structure, $Al_xGa_{1-x}N$ were also observed. The GaN/InGaN active layer cannot be mapped due to the limit of spatial resolution. However, observation of sharp polar modes and their intensity reflect the facet quality. Similarly, the local strain distribution shows subsequent variation in the value of in plane strain tensor components. From the analysis of spectra recorded from 4 μm above the interface, the biaxial stress was found to be 0.46 GPa in the ELO region and decreases up to 0.29 GPa at 8 μm above the interface. We found that in the ELO region above the mask, the strain relaxes much faster. Measurements from the facet region above ELO GaN (above 12 μm from the interface) and close to surface shows different behaviour due to change in material composition due to cladding layers. The modes near 637, 671, and 832 $cm^{-1}$ can be associated with $Al_xGa_{1-x}N$ TO and LO modes in the cladding layers. The appearance of mode shows the quality of the cleaved facet. Material quality of the cleaved facet can be judged from the Raman intensity and line width of the alloy phonons. Appearance of few forbidden modes from the facets can be associated with wing tilt, which leads to polarisation breakdown.

In the back scattering geometry along the [0001] axis, the $E_2$ phonon is allowed by the selection rules in both $z(xx)\bar{z}$ and $z(xy)\bar{z}$ configurations, in contrast with the $A_1(LO)$ phonon, allowed in the parallel geometry only. On the other hand, the $A_1TO)$ phonon can be observed in the $x(zz)\bar{x}$ and $x(yy)\bar{x}$ configurations, realised in the back scattering geometry perpendicular to the c-axis. Here, [0001] and [11$\bar{2}$0] directions of the GaN were used as the z-axis and x-axis, respectively. The observation of very weak intensity of the forbidden modes in a particular geometry reveals that the misalignment between the cleavage planes is very small. In addition, compositional fluctuations, strain induced disorder, wing tilt, and cross-section geometry may result in the break down of polarization selection rules. Though it is very difficult to align the GaN cleaved planes along the polarization geometry, the recording conditions permit us to rotate the plane of polarization. Choosing appropriate geometry and orientations of the cleaved ELOG layer, the intensity of the forbidden modes is very weak and confirms the presence of vertical cleaved facets. We have also compared the cleaved facets GaN/sapphire with the dry etched facets produced by inductively coupled plasma (ICP) etching. Typical facets produced by $Cl_2/BCl_3$ based ICP etching have a slope of 5°–9° and are relatively rough compared to the cleaved facets.

The primary conclusion from fabricating etched facets is that different plasma conditions (temperature, gas composition, plasma density and acceleration voltage) need to be applied to control the roughness and slope of these facets. Also after the formation of etched facets, the devices are required to be separated by some more back-end processing.

It will be appreciated by persons skilled in the art that numerous variations and/or modifications may be made to the invention as shown in these specific embodiments without departing from the spirit or scope of the invention as broadly described. The present embodiments are, therefore, to be considered in all respects as illustrative and not restrictive.

The invention claimed is:

1. A method of fabricating a cleaved facet of a laser device, said device having a substrate with a thickness of between 350 μm and 400 μm formed of c-plane sapphire and at least one GaN-based layer formed upon a first surface of the substrate, said method including the following steps:
   cuffing linear grooves into a second surface of the substrate, said grooves being in alignment with vertical planes of said substrate, the vertical planes being selected from at least one of m-planes (1100) or a-planes (1120); and
   cleaving said substrate and said at least one GaN-based layer along said vertical planes; wherein said cuffing is effected by a laser beam from an external laser source, wherein the cleaved facet has a surface roughness of 19–26 nm.

2. The method according to claim 1, wherein the vertical planes are the a-planes (1120).

3. The method according to claim 1, wherein the grooves are cut to a depth of from about 40 μm to about 100 μm.

4. The method according to claim 3, wherein the grooves are cut to a depth of from about 50 μm to about 80 μm.

5. The method according to claim 3, wherein the depth of said grooves is controlled by process parameters including an intensity of the laser beam, a speed at which the laser beam is scanned over the grooves and a number of times the laser beam is scanned over said grooves.

6. The method according to claim 5, wherein the laser beam was focused on the second surface of the substrate within a radius of from about 20 μm to about 30 μm at $1/e^2$ density.

7. The method according to claim 5, wherein an average power of the laser beam is about 1.4 W.

8. The method according to claim 5, wherein a repetition rate of the laser beam is from about 2 kHz to about 5 kHz.

9. The method according to claim 5, wherein a pulse width of the laser beam is from about 5 ns to about 30 ns.

10. The method according to claim 5, wherein the laser beam is scanned over the second surface of the substrate from 2 to about 12 times at a velocity of about 1 mm/sec.

11. The method according to claim 1, wherein the at least one GaN-based layer includes a plurality of GaN-based layers.

12. The method according to claim 11, wherein the plurality of GaN-based layers include GaN/InGaN/AlGaN layers.

13. The method according to claim 11, wherein the GaN-based layers are formed using epitaxial lateral overgrowth (ELOG) techniques.

14. The method according to claim 1, wherein the cleaved facet has an average r.m.s. roughness $r_{av}$ of 22 nm.

15. A method of fabricating a cleaved facet of a laser device, said device having a substrate with a thickness of between 350 μm and 400 μm formed of c-plane sapphire and at least one GaN-based layer formed upon a first surface of the substrate, said method including the following steps:
   cuffing linear grooves into a second surface of the substrate, said grooves being in alignment with vertical planes of said substrate, the vertical planes being selected from at least one of in-planes (1100) or a-planes (1120); and
   cleaving said substrate and said at least one GaN-based layer along said vertical planes; wherein said cuffing is effected by a laser beam from an external laser source, wherein the cleaved facet has a surface roughness of 16–26 nm for a laser structure on epitaxial lateral overgrowth (ELOG) and sapphire.

16. The method according to claim 15, wherein the cleaved facet has an average r.m.s. roughness $r_{av}$ of 21 nm.

17. A method of fabricating a cleaved facet of a laser device, said device having a substrate with a thickness of between 350 μm and 400 μm formed of c-plane sapphire and at least one GaN-based layer formed upon a first surface of the substrate, said method including the following steps:

cuffing linear grooves into a second surface of the substrate, said grooves being in alignment with vertical planes of said substrate, the vertical planes being selected from at least one of m-planes (1100) or a-planes (1120); and cleaving said substrate and said at least one GaN-based layer along said vertical planes; wherein said cuffing is effected by a laser beam from an external laser source, wherein the cleaved facet has a surface roughness of 26 nm or less.

* * * * *